US009049245B2

(12) United States Patent
Higgins et al.

(10) Patent No.: US 9,049,245 B2
(45) Date of Patent: Jun. 2, 2015

(54) METHOD AND APPARATUS FOR FLEXIBLY CONVERTING AND ROUTING DATA BETWEEN DISPARATE SYSTEMS

(71) Applicant: McKesson Financial Holdings, Hamilton (BM)

(72) Inventors: Lance Higgins, Birmingham, AL (US); Bryan Self, Birmingham, AL (US)

(73) Assignee: McKesson Financial Holdings, Hamilton (BM)

( * ) Notice: Subject to any disclaimer, the term of this patent is extended or adjusted under 35 U.S.C. 154(b) by 173 days.

(21) Appl. No.: 13/661,893

(22) Filed: Oct. 26, 2012

(65) Prior Publication Data

US 2014/0122734 A1    May 1, 2014

(51) Int. Cl.
   *G06F 15/16*    (2006.01)
   *H04L 29/08*    (2006.01)
   *H04L 29/06*    (2006.01)
   *H03M 5/00*    (2006.01)

(52) U.S. Cl.
   CPC .............. *H04L 67/2838* (2013.01); *H04L 69/08* (2013.01); *H04L 67/2823* (2013.01); *H03M 5/00* (2013.01); *H04L 67/2814* (2013.01)

(58) Field of Classification Search
   CPC ....... H04L 69/08; H04L 67/2823; H03M 5/00
   USPC ........... 709/200–203, 217–231, 238; 715/249
   See application file for complete search history.

(56) References Cited

U.S. PATENT DOCUMENTS

| 5,410,675 | A | 4/1995 | Shreve et al. | |
|---|---|---|---|---|
| 6,680,740 | B2 * | 1/2004 | Krueger | 345/601 |
| 6,711,624 | B1 | 3/2004 | Narurkar et al. | |
| 6,810,409 | B1 * | 10/2004 | Fry et al. | 709/202 |
| 6,889,260 | B1 | 5/2005 | Hughes | |
| 7,756,951 | B2 * | 7/2010 | Nemoto | 709/220 |
| 7,827,562 | B1 | 11/2010 | Hoerle et al. | |
| 8,099,736 | B2 | 1/2012 | Hoerle et al. | |
| 8,250,239 | B2 * | 8/2012 | Honjo | 709/246 |
| 8,519,996 | B2 * | 8/2013 | Baier et al. | 345/418 |
| 8,655,875 | B2 * | 2/2014 | Young | 707/736 |
| 2002/0180755 | A1 * | 12/2002 | Krueger | 345/601 |
| 2005/0160361 | A1 * | 7/2005 | Young | 715/513 |
| 2006/0064442 | A1 * | 3/2006 | Nemoto | 707/202 |
| 2013/0160063 | A1 * | 6/2013 | Rashid | 725/109 |
| 2013/0342546 | A1 * | 12/2013 | Baier et al. | 345/501 |

\* cited by examiner

*Primary Examiner* — Moustafa M Meky
(74) *Attorney, Agent, or Firm* — Alston & Bird LLP (57) ABSTRACT

A method, apparatus and computer program product are provided to facilitate the transfer of data from a source system to a recipient system in instances in which the source and recipient systems process data having different data stream types, such as differently formatted data. In regards to a method, data is received from any one of a plurality of source systems, each of which has a respective first data stream type. The method determines a recipient system from among a plurality of candidate recipient systems and determines a second data stream type accepted by the recipient system. The method directs the data to a first processing module of a plurality of processing modules based upon the source system, the recipient system and the first and second data stream types. The method processes the data with the first processing module based upon a recipient system and its second data stream type.

20 Claims, 6 Drawing Sheets

METHOD AND APPARATUS FOR FLEXIBLY CONVERTING AND ROUTING DATA BETWEEN DISPARATE SYSTEMS

TECHNOLOGICAL FIELD

An example embodiment of the present invention relates generally to data conversion and, more particularly, to the flexible conversion and routing of data between disparate systems.

BACKGROUND

Data is maintained by a number of different systems. It is oftentimes desirable to provide the data maintained by one system to another system. For example, it may be desired to populate the database of one system with the data extracted from another system, such as to synchronize the databases or migrate the data to a different system, such as to transfer data from a legacy system to a newer system and/or to transfer data to a third party system. While some systems are configured to process and store data of the same data stream type, such as data having the same format, many systems are configured to process and store data in accordance with different data stream types, such as by data having different formats. As such, data that is intended to be transferred between systems that operate in accordance with different data stream types, such as in accordance with differently formatted data, cannot simply be transferred therebetween since the recipient system would be unable to properly interpret the data. Instead, an interface may be developed to facilitate the transfer of data between the disparate systems. The interface may be relatively costly to develop since the software that implements the interface must be written specifically for data transferred between the two systems. As such, a different interface must be designed for each unique pair of systems between which data is to be transferred, thereby further increasing the costs associated with such data transfer.

By way of example, a healthcare system may include a plurality of systems, many of which may process and store data that is formatted in different manners. For example, a healthcare system may include a clinical system including a clinicals database, a quality monitoring system having a quality monitoring database and systems relating to the laboratory, orders, results, patient administration that have respective databases. The databases of each of these systems, including the clinicals database and the quality monitoring database, may each be configured to process and store differently formatted data. However, it may be useful in some instances to transfer data between the databases. In order to do so, however, an interface must be developed that is specifically designed to facilitate the transferred data between the clinicals database and the quality monitoring database. Separate interfaces must then be developed if data is to be transferred between any of the other systems that process and store differently formatted data.

BRIEF SUMMARY

A method, apparatus and computer program product are provided in accordance with an embodiment of the present invention in order to facilitate the transfer of data from a source system to a recipient system in instances in which the source and recipient systems process data having different data stream types, such as differently formatted data. In one embodiment, the method, apparatus and computer program product may be configured to facilitate the transfer between any one of a plurality of different source systems that utilize different data stream types and any one of a plurality of different recipient systems, each of which may also utilize different data stream types. As such, the method, apparatus and computer program product of this embodiment is flexible in terms of the source and recipient systems between which data may be effectively transferred, thereby facilitating the transfer of data between the source and recipient systems in a manner that is less cumbersome and more efficient.

In one embodiment, a method is provided that includes receiving data from any one of a plurality of source systems. The data received from each source system has a respective first data stream type. The method of this embodiment also includes determining a recipient system of the data from among a plurality of candidate recipient systems. In this regard, the method also determines a second data stream type accepted by the recipient system. The method of this embodiment additionally directs the data to a first processing module of a plurality of processing modules based upon the source system of the recipient system and the first and second data stream types. The first processing module is associated with a respective pair of first and second data stream types. The method of this embodiment also processes the data with the first processing module based upon a recipient system and the second data stream type accepted by the recipient system. The method of this embodiment further routes the data following the processing to at least one of a plurality of candidate destinations including the recipient system. In one embodiment, for example, the method may route the data to a plurality of destinations.

In regards to the processing of the data, the method of one embodiment may process the data with a style sheet to identify a predefined event. In this embodiment, the method may also include notifying the recipient system in an instance in which the predefined event is identified. Additionally or alternatively, the method may process the data by processing the data with a style sheet to determine one or more statistics related to the data received from the source system. The method of one embodiment may route the data by routing the data following the processing to an application programming interface of the recipient system. In this embodiment, the second data stream type accepted by the recipient system is defined by the application programming interface.

The method one embodiment may route the data by routing the data to a second processing module of the plurality of processing modules for further processing prior to delivery to a recipient system. In this embodiment, the method may access a configuration data stream that defines an ordered sequence of a plurality of processing modules to be traversed in order to process the data prior to delivery to the recipient system. Thus, the routing and directing of the data may be performed in response to the ordered sequence of the plurality of processing modules defined by the configuration file. In an embodiment in which the data is routed to a second processing module, the method may process the data with the first processing module in order to convert data of the first data stream type to data of the second data stream type with the second processing module then customizing the data of the second data stream type in accordance with the recipient system.

In another embodiment, an apparatus is provided that includes processing circuitry configured to receive data from any one of a plurality of source systems. The data received from each source system has a respective first data stream type. The processing circuitry of this embodiment is also configured to determine a recipient system of the data from among a plurality of candidate recipient systems. In this regard, the processing circuitry is also configured to determine a second data stream types accepted by the recipient system. Further, the processing circuitry of this embodiment is configured to direct the data to a first processing module of a plurality of processing modules based upon the source system, the recipient system and the first and second data stream types. The first processing module is associated with a respective pair of first and second data stream types. The processing circuitry of this embodiment is also configured to process the data with the first processing module based upon the recipient system and the second data stream type accepted by the recipient system. Further, the processing circuitry of this embodiment is configured to route the data following the processing to at least one of a plurality of candidate destinations including the recipient system. For example, the processing circuitry may be configured to route the data by routing the data to a plurality of destinations.

In regards to the processing of the data, the processing circuitry of one embodiment may be configured to process the data with a style sheet to identify a predefined event. In this embodiment, the processing circuitry may be further configured to notify the recipient system in an instance in which the predefined event is identified. Additionally or alternatively, the processing circuitry may be configured to process the data with a style sheet to determine one or more statistics related to the data received from the source system. In one embodiment, the processing circuitry may be configured to route the data by routing the data following the processing to an application programming interface of the recipient system. In this embodiment, the second data stream type accepted by the recipient system is defined by the application programming interface.

The processing circuitry of one embodiment may be configured to route the data by routing the data to a second processing module of the plurality of processing modules for further processing prior to delivery to the recipient system. In this embodiment, the processing circuitry may be configured to access a configuration data stream that defines an ordered sequence of a plurality of processing modules to be traversed in order to process the data prior to delivery to the recipient system. Thus, the processing circuitry of this embodiment may be configured to route and direct the data in response to the ordered sequence of the plurality of processing modules defined by the configuration file. In an embodiment in which the data is routed to a second processing module, the processing circuitry may also be configured to process the data with the first processing module by converting data of the first data stream type to data of the second data stream type. The processing circuitry of this embodiment may also be configured to process the data with the second processing module in order to customize the data of the second data stream type in accordance with the recipient system.

In a further embodiment, a computer program product is provided that includes at least one non-transitory computer-readable storage medium having computer-executable program code portions stored therein with the computer-executable program code portions including program code instructions for receiving data from any one of a plurality of source systems. The data received from each source system has a respective first data stream type. The computer-executable program code portions of this embodiment also include program code portions for determining the recipient system of the data from among a plurality of candidate recipient systems. In this regard, the program code instructions for determining the recipient system include program code instructions for determining a second data stream type accepted by the recipient system. The computer-executable program coded portions of this embodiment also include program code instructions for directing the data to a first processing module of a plurality of processing modules based upon the source system, the recipient system and the first and second data stream types. In this regard, the first processing module is associated with a respective pair of first and second data stream types. The computer-executable program code portions of this embodiment also include program code instructions for processing the data with the first processing module based upon the recipient system and the second data stream type accepted by the recipient system. The computer-executable program code portions of this embodiment also include program code instructions for routing the data following the processing to at least one of a plurality of candidate destinations including the recipient system.

The program code instructions for processing the data in accordance with one embodiment may include program code instructions for processing the data with a style sheet to identify a predefined event. In this embodiment, the computer-executable program code instructions may also include program code instructions for notifying the recipient system in an instance in which the predefined event is identified. The program code instructions for processing the data in accordance with another embodiment may include program code instructions for processing the data with a style sheet to determine one or more statistics related to the data received from the source system. The program code instructions for routing the data in accordance with one embodiment may include program code instructions for routing the data following the process into an application programming interface of the recipient system. In this embodiment, the second data stream type accepted by the recipient system is defined by the application programming interface.

The program code instructions for routing the data in accordance with one embodiment may include program code instructions for routing the data to a second processing module of a plurality of processing modules for further processing prior to delivery to the recipient system. In this embodiment, the computer-executable program code portions may also include program code instructions for accessing a configuration data stream that defines an ordered sequence of a plurality of processing modules to be traversed in order to process the data prior to delivery to the recipient system. Thus, the program code portions for directing and for routing the data in accordance with this embodiment may be configured to route and direct the data in response to the ordered sequence of the plurality of processing modules defined by the configuration file. In an embodiment in which the data is routed to a second processing module, the program code instructions for processing the data with the first processing module may include program code instructions for converting data of the first data stream type to data of the second data stream type. The computer-executable program code portions of this embodiment may also include program code instructions for processing the data with the second processing module in order to customize the data of the second data stream type in accordance with the recipient system.

BRIEF DESCRIPTION OF THE DRAWINGS

Having thus described certain embodiments of the invention in general terms, reference will now be made to the accompanying drawings, which are not necessarily drawn to scale, and wherein:

DETAILED DESCRIPTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 1:
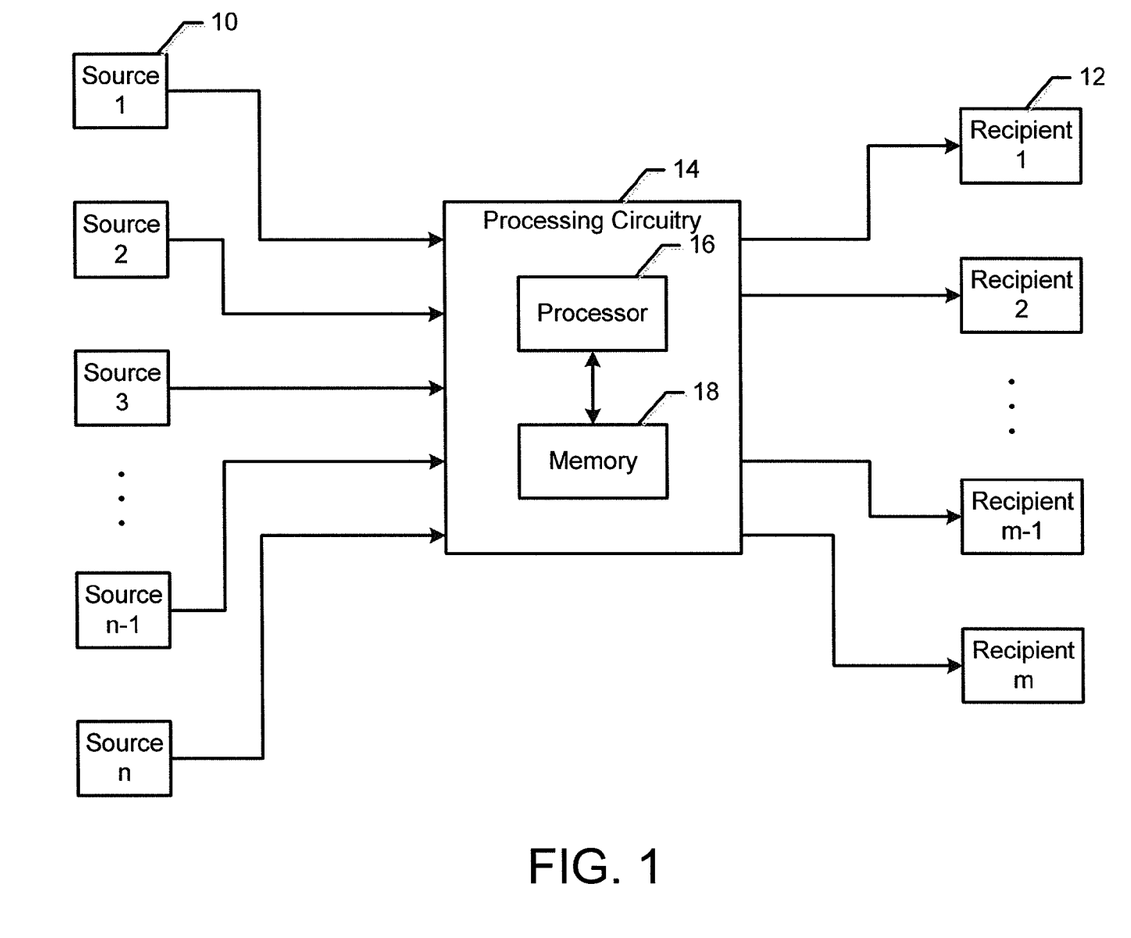
FIG. 1 is a block diagram illustrating a system that may be specifically configured in accordance with an example embodiment to the present invention.

Referring now to FIG. 1, a system that may be specifically configured in order to flexibly support data transfer between a wide variety of source systems 10 and a wide variety of recipient systems 12, many of which may operate in accordance with different data stream types, such as different data stream types, e.g., differently formatted data, is illustrated. In this regard, the system includes processing circuitry 14 for receiving data from one or more of a plurality of source systems, for processing the data including converting the data into the data stream type(s) accepted by one or more of the recipient systems and for providing the resulting data to the intended recipient system(s).

As shown in FIG. 1, the processing circuitry 14 may be configured to receive data from a plurality of source systems 10, such as n source systems. While some of these source systems may provide data having the same data stream type, such as data that is formatted the same, a plurality of the source systems may provide data that has different data stream types, such as differently formatted data. By way of example, but not of limitation, the source systems may include a source system that provides HL7 data, a source system that provides a flat file, a source system that provides images, a source system that provides raw socket data, a source system that provides comma-separated values (CSVs) and/or a source system that provides a query result set from a direct database connection. As also shown in FIG. 1, the processing circuitry may be configured to provide the resulting data to one or more of a plurality of recipient systems 14, such as m recipient systems as shown in FIG. 1. While some of the recipients systems may be configured to receive data of the same data stream type, such as data having the same format, a plurality of the recipient systems are configured to receive data of different data stream types, such as differently formatted data. Moreover, the data stream types accepted by a plurality of the recipient systems may differ from the data stream types provided by a plurality of the source systems such that the processing circuitry must appropriately convert the data in order to permit the data from a source system to be properly interpreted by a recipient system. By way of example, but not of limitation, the recipient systems may include a database, a transport system, an email notification system, an HL7 engine, a reporting database or other types of recipient systems.

The processing circuitry 14 may be configured to perform data processing, application execution and/or other processing and management services. In some embodiments, the processing circuitry may be embodied as a chip or chip set. In other words, the processing circuitry may comprise one or more physical packages (e.g., chips) including materials, components and/or wires on a structural assembly (e.g., a baseboard). The processing circuitry may therefore, in some cases, be configured to implement an embodiment of the present invention on a single chip or as a single "system on a chip." As such, in some cases, a chip or chipset may constitute means for performing one or more operations for providing the functionalities described herein.

In an example embodiment, the processing circuitry 14 may include a processor 16 and memory 18 that may be in communication with or otherwise control a communication interface that may communicate with the source systems 10 and the recipient systems 14. As such, the processing circuitry may be embodied as a circuit chip (e.g., an integrated circuit chip) configured (e.g., with hardware, software or a combination of hardware and software) to perform operations described herein.

In an example embodiment, the memory 18 may include one or more non-transitory memory devices such as, for example, volatile and/or non-volatile memory that may be either fixed or removable. The memory may be configured to store information, data, applications, instructions or the like for enabling the processing circuitry 14 to carry out various functions in accordance with example embodiments of the present invention. For example, the memory could be configured to buffer input data for processing by the processor 16. Additionally or alternatively, the memory could be configured to store instructions for execution by the processor. As yet another alternative, the memory may include one of a plurality of databases that may store a variety of files, contents or data sets. Among the contents of the memory, applications may be stored for execution by the processor in order to carry out the functionality associated with each respective application. In some cases, the memory may be in communication with the processor via a bus for passing information among components of the apparatus.

The processor 16 may be embodied in a number of different ways. For example, the processor may be embodied as various processing means such as one or more of a microprocessor or other processing element, a coprocessor, a controller or various other computing or processing devices including integrated circuits such as, for example, an ASIC (application specific integrated circuit), an FPGA (field programmable gate array), or the like. In an example embodiment, the processor may be configured to execute instructions stored in the memory 18 or otherwise accessible to the processor. As such, whether configured by hardware or by a combination of hardware and software, the processor may represent an entity (e.g., physically embodied in circuitry—in the form of processing circuitry) capable of performing operations according to an embodiment of the present invention while configured accordingly. Thus, for example, when the processor is embodied as an ASIC, FPGA or the like, the processor may be specifically configured hardware for conducting the operations described herein. Alternatively, as another example, when the processor is embodied as an executor of software instructions, the instructions may specifically configure the processor to perform the operations described herein.

Figure 2:
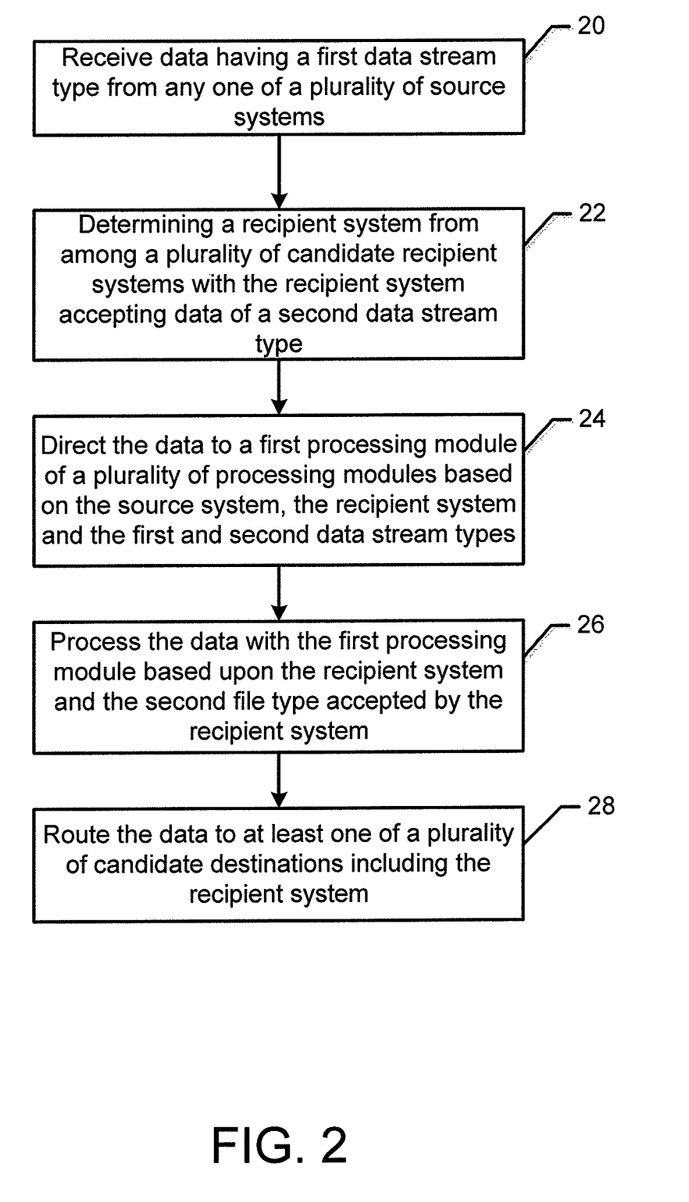
FIG. 2 is a flowchart illustrating operations performed, such as by the processing circuitry of FIG. 1, in accordance with an example embodiment of the present invention.

Referring now to FIG. 2, the operations performed by the processing circuitry 14 in accordance with an example embodiment of the present invention are illustrated. As reflected by block 20 of FIG. 2, the processing circuitry, such as the processor 16, may be configured to receive data from any one of a plurality of the source systems 10. The data that is received by the processing circuitry has a first data stream type, such as a first format, as the result of the manner in which the respective source system is configured to output data. The processing circuitry may be configured to receive data in various manners and for various reasons. For example, the source system may provide the data to the processing system along with an indication as to the recipient system(s) 12 to which the data is directed. Alternatively, the processing circuitry may poll a source system for data, thereby requesting that the source system provide data to the processing circuitry for subsequent provision to one or more recipient systems. The transferred data from one or more source systems to one or more recipient systems may be performed for various reasons including system integration or system migration such as from a legacy system, e.g., a source system, to a replacement system, e.g., a recipient system, or from an internal system, e.g., a source system, to a third party system, e.g., a recipient system. Further, the transferred data from one or more source systems to one or more recipient systems may be performed in order to populate the database of one or more recipient systems or to synchronize the databases of one or more source systems and one or more recipient systems.

Regardless of the reason for transferring the data from a source system 10 to a recipient system 12, the processing circuitry 14, such as the processor 16, may be configured to determine a recipient system for the data from among the plurality of candidate recipient systems. See block 22 of FIG. 2. In this regard, the candidate recipient systems may include all or at least a subset of the recipient systems with which the processing circuitry is in communication and is configured to support. The processing circuitry, such as the processor, may be configured to determine the recipient system in various manners. For example, the data provided by a source system may be associated with an indication as to the recipient system to which the data is directed. Alternatively, the processing circuitry may have received a request for or an instruction to obtain data from one or more of the source systems and to provide the converted data to one or more recipient systems, thereby causing the processing circuitry to poll one or more source systems for data which is then processed and converted prior to being provided to the recipient system(s) that was the subject of the original request or instruction.

In conjunction with determining the recipient system 12 of the data, the processing circuitry 14, such as the processor 16, may also be configured to determine the data stream type accepted by the recipient system. In this regard, the processing circuitry, such as the memory 18, may store information defining the data stream type accepted by one or more of the recipient systems with which the processing circuitry is in communication. Alternatively, the data stream type accepted by the recipient system may be provided by the source system along with the indication as to the recipient system to which the data is to be directed. Still further, the data stream type accepted by the recipient system may be provided along with the request or instruction that is provided to the processing circuitry in regards to data to be transferred from one or more source systems to one or more recipient systems. As yet another embodiment, the processing circuitry, such as the processor, may be configured to communicate with a recipient system in order to obtain information from the recipient system defining the data stream type accepted by the recipient system.

As shown in block 24 of FIG. 2, the processing circuitry 14, such as the processor 16, may be configured to direct the data received from a source system 10 to a first processing module of a plurality of processing modules. In this regard, the processing circuitry, such as the processor, may be configured to direct the data to a first processing module based upon the source system 10, the recipient system 12 and the first and second data stream types of the source and recipient systems, respectively. In this regard, the processing modules, including the first processing module to which the data is directed, may be comprised by the processing circuitry, such as the processor.

Figure 3:
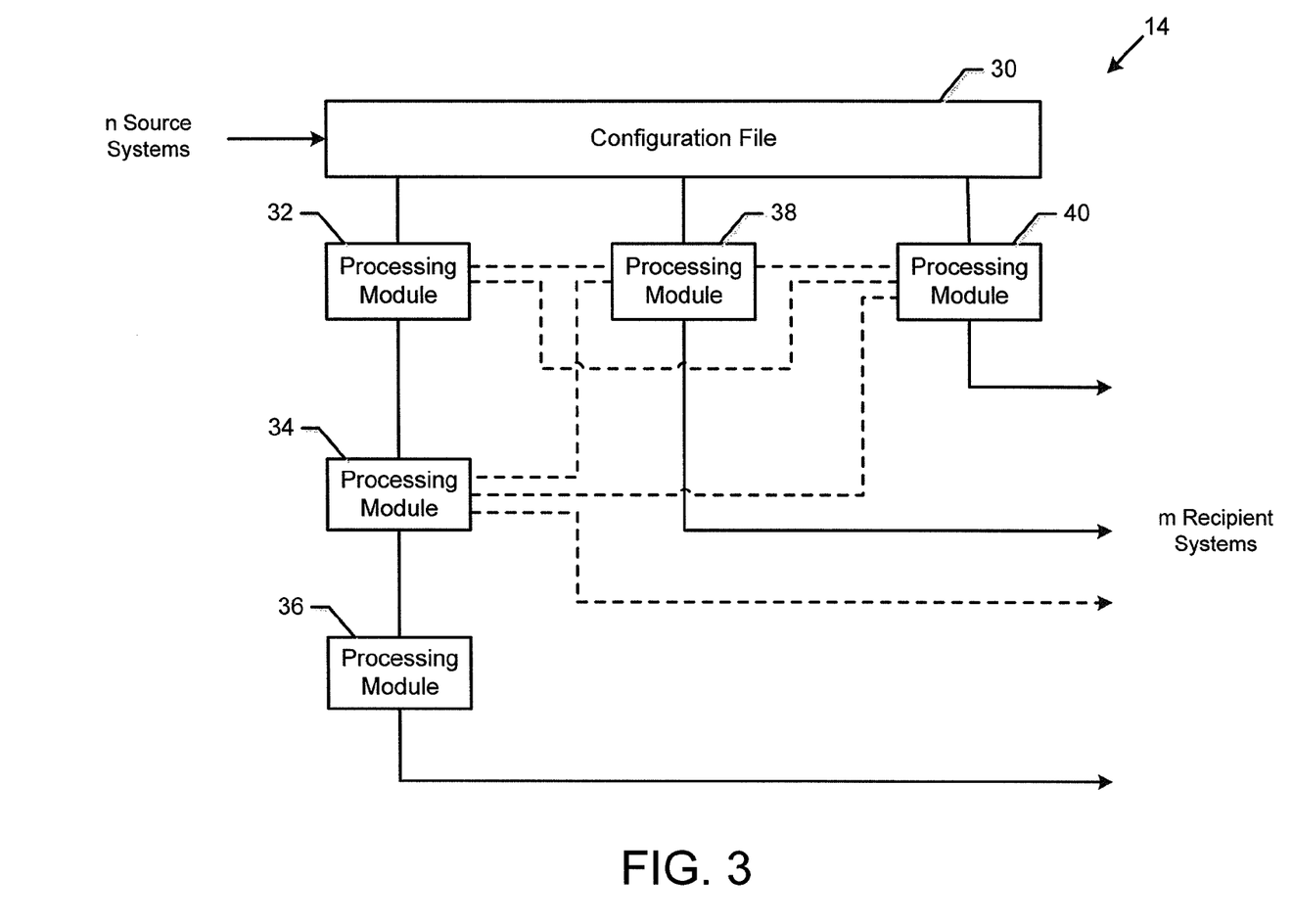
FIG. 3 is a block diagram of the processing circuitry of FIG. 1 in accordance with an example embodiment of the present invention.

In the embodiment shown in FIG. 3, for example, the processing circuitry 14 may include a configuration file that may be stored by the memory 18 and executed by the processor 16. The configuration file may be configured to determine one or more processing modules that will be required in order to appropriately process the data received from a source system 10 with a first data stream type prior to delivery to a recipient system that accepts a second data stream type. The configuration file is also configured to determine the ordered sequence in which the data is to flow from one processing module to another. In this regard, the configuration file may define a plurality of ordered sequences based upon the source system, the recipient system and the first and second data stream types. Moreover, the processing module(s) may be included in two or more of the ordered sequences. Thus, the configuration file permits the processing modules to be ordered in a plurality of different ways so as to convert between a variety of data stream types. Additionally, the configuration file may be updated in order to reference new processing modules and/or to differently define the ordered sequences, thereby accommodating additional source systems and/or recipient systems. As such, the processing circuitry may access the configuration file in order to direct the data received from the source system to a first processing module.

Although the processing circuitry 14, such as the processor 16, may include any number of processing modules. The processing circuitry of the embodiment illustrated in FIG. 3 includes three processing modules 32, 38 and 40 to which the data from the source system 10 may initially be directed. As noted above, the particular processing module to which the data is directed is based upon the source system, the recipient system 12 and the first and second data stream types. For example, processing module 32 may be configured to convert data from the first data stream type provided by the source system to the second data stream type accepted by the recipient system, while processing modules 38 and 40 may be configured to convert data between two different data stream types. As such, the configuration file 30 of this embodiment may be configured to direct the data received from the source system to the processing module 32 in order to obtain the desired conversion from the first data stream type to the second data stream type.

As shown in block 26 of FIG. 2, the processing circuitry 14, such as the processor 16, may be configured to process the data with the first processing module 32 based upon the recipient system 12 and the second data stream type accepted by the recipient system. For example, the first processing module may be configured to convert the data from the first data stream type in which the data is provided by the source system 10 to the second data stream type accepted by the recipient system. In other embodiments, processing module 32 may be configured to process the data in a number of different manners, some of which will be described below, while another one of the processing modules will be configured to convert the data from the first data stream type of the source system to the second data stream type accepted by the recipient system. Thus, the processing module configured to convert the data from the first data stream type of the source system to the second data stream type accepted by the recipient system need not be the initial processing module to which the data from the source system is directed and, instead, the processing module configured to convert the data from the first data stream type to the second data stream type may be a subsequent processing module in the sequence of processing modules through which the data flows pursuant to the configuration data stream 30.

Thereafter and as shown in block 28 of FIG. 2, the processing circuitry 14, such as the processor 16, may be configured to route the data to at least one of a plurality of candidate destinations, which include the recipient system that accepts second data stream types. Following its conversion of the data, the first processing module may directly route the data to the intended recipient system. However, the first processing module may, in other embodiments, route the data to other processing modules for further processing. In the embodiment illustrated in FIG. 3, for example, processing module 32 may route the data to processing module 34 and, in turn, to processing module 36 prior to routing the data to the intended recipient system. Each of the processing modules performs a particular processing task with the sequence of the processing modules being defined by the configuration file 30 so as to accomplish the intended result including, but not limited to, the conversion of the data from the first data stream type to the second data stream type. The data may be routed through the various processing modules in various manners depending upon the source and recipient devices and correspondingly the first and second data stream types as well as any other processing functionality that is to be provided.

As shown by dashed lines, the configuration file 30 may alternatively direct the processing module 32 to route the data to processing module 38 or processing module 40. The configuration file of one embodiment may also cause processing module 34 to route the data to processing module 38, to processing module 40 or to an intended recipient system. Regardless of the number of processing modules and the sequence in which the processing modules operate upon the data, at least one of the processing modules is associated with the respective pair of first and second data stream types and is configured to process the data based upon the recipient system 12 and the second data stream type accepted by the recipient system such that the data is converted from the first data stream type of the source system 10 to the second data stream type accepted by the recipient system.

As noted above, in addition to converting the data from a first data stream type to a second data stream type, various ones of the processing modules may perform other functions. For example, a processing module of one embodiment may be configured to process the data with a style sheet in order to identify a predefined event. In an instance in which the predefined event is identified, the processing module of this embodiment may be configured to cause a recipient system 12 to be notified. Additionally or alternatively, the processing module may be configured to transmit a notification via an email to a pager, post a notification to an alerting application and/or post a notification, e.g., eventXML, to an application programming interface (API) of the recipient system. Alternatively, a processing module may be configured to process the data with a style sheet to determine one or more statistics or metrics related to the data received from the source system 10. Based upon the processing provided by the style sheets, the processing circuitry 14 may generate corresponding logs, reports or the like.

Figure 4:
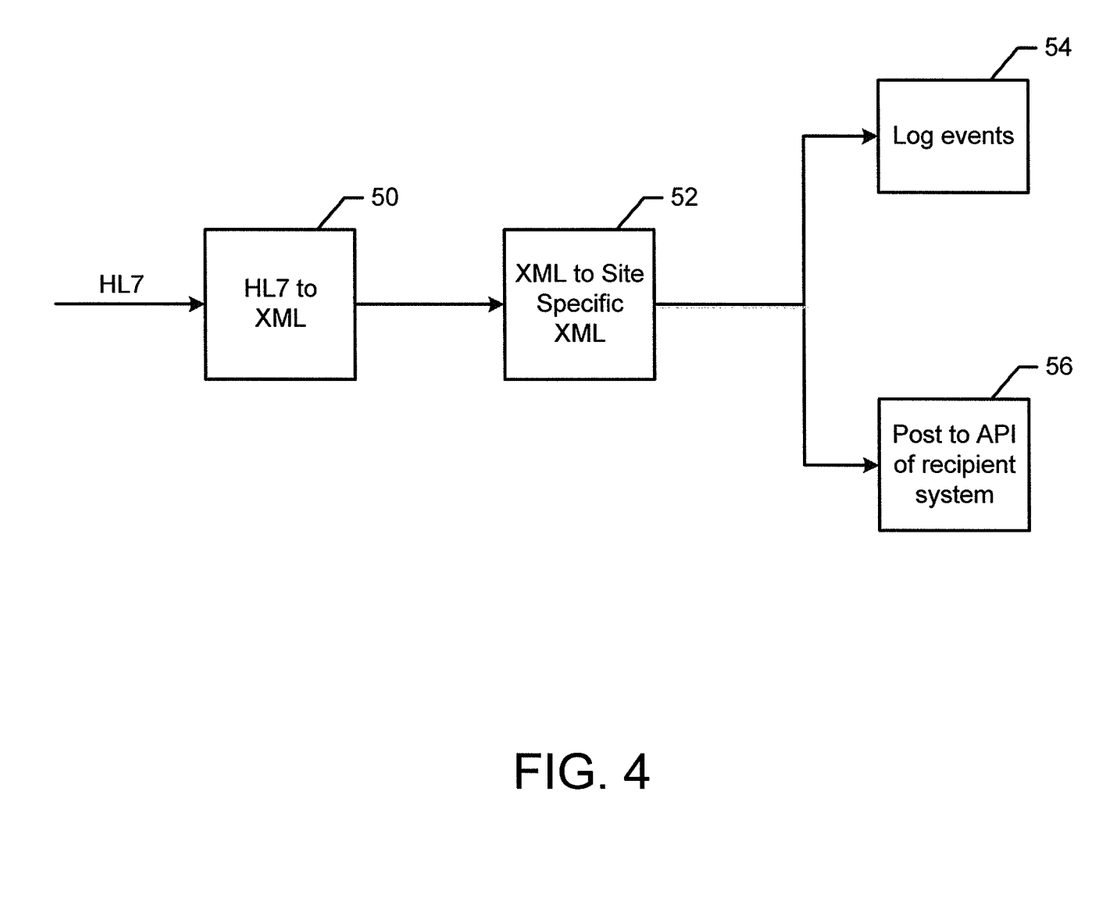
FIG. 4 is a flowchart illustrating operations performed by the processing circuitry of one embodiment of the present invention.

Although the method, apparatus and computer program product of an example embodiment may be deployed in a variety of scenarios, several examples of specific configurations of the processing circuitry 14 will be described below for purposes of example, but not of limitation. With reference to FIG. 4, for example, the operations performed by the processing circuitry in order to post HL7 data received from a source system 10 to the API of a recipient system 12, such as a web service, are illustrated. As shown in block 50, the HL7 data received from the source system may be directed to a processing module that is configured to convert the HL7 data to XML data. In the illustrated embodiment, the application programming interface of the recipient system to which the data is directed requires site specific customizations to the XML data. Thus, the configuration file 30 may direct the XML data following the conversion from HL7 data to a processing module 52 configured to apply site specific customizations to the XML data. In this regard, the processing module that is configured to apply the site specific customizations may process the XML data with a style sheet in order to identify one or more predefined events. In an instance in which one or more events are identified by the style sheet, the events may be logged as shown by block 54 and/or the recipient system may be notified. Additionally, the processing circuitry may be configured to post the site specific XML that has been generated to the API of the recipient system, thereby providing data from the source system to the recipient system in a manner that may be readily interpreted and utilized by the recipient system. See block 56 of FIG. 4.

Figure 5:
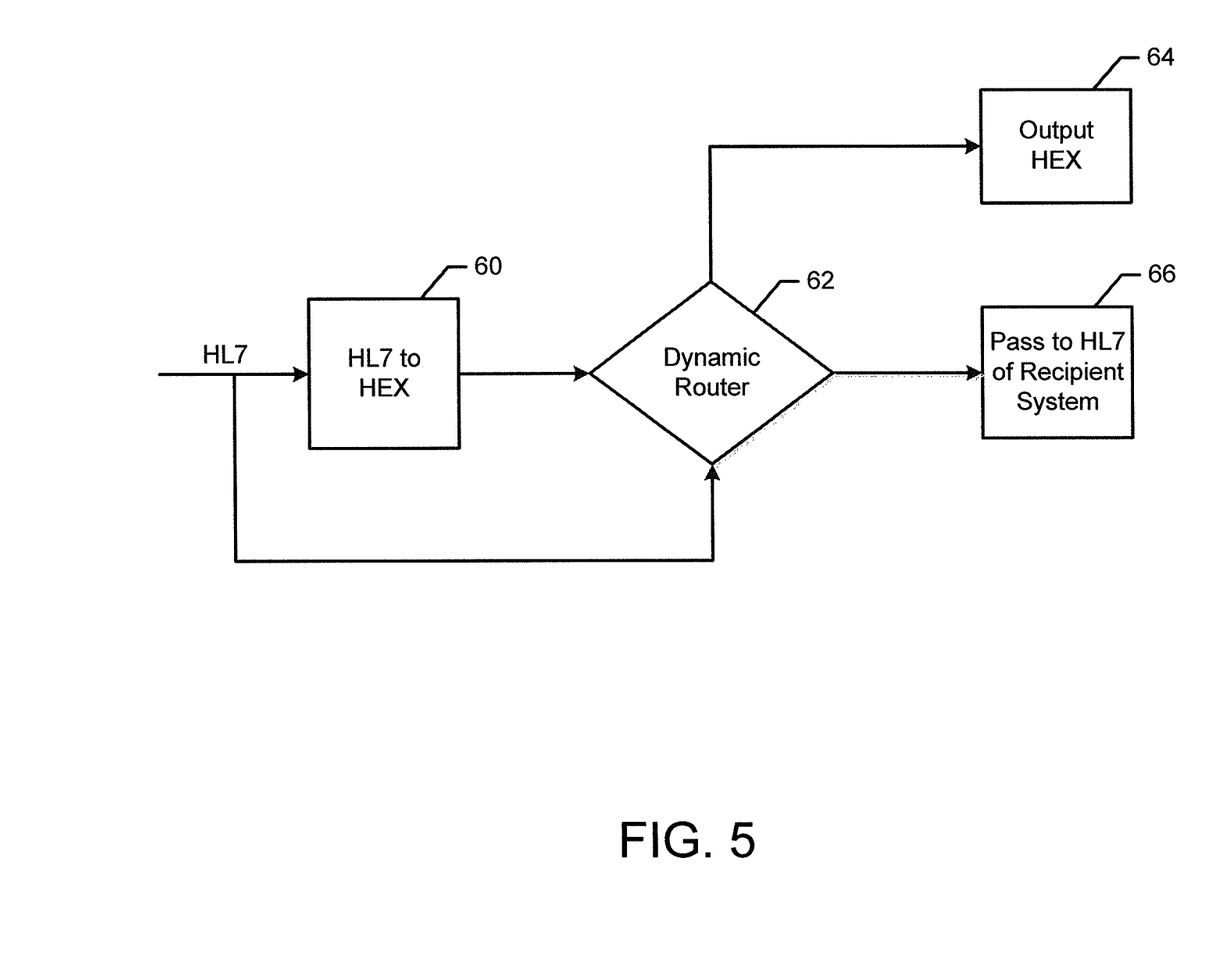
FIG. 5 is a flowchart illustrating operations performed by the processing circuitry of another embodiment of the present invention.

Referring now to FIG. 5, the operations performed by the processing circuitry 14 in accordance with another embodiment in which the HL7 data received from the source system 10 is both provided as a hexadecimal output to a recipient system 12, such as a console, as well as HL7 data to another recipient system. In this regard, the configuration file 30 of this embodiment may direct the HL7 data that is received to a processing module 60 configured to convert the HL7 data to hexadecimal data. In this embodiment, the processing circuitry may be configured to provide both the resulting hexadecimal data and the original HL7 data to a router 62. The router may be embodied by a processing module and may, in some embodiments, be configured to route the data to a plurality of destinations. Additionally, the router of some embodiments may be configured to receive a plurality of different types of data and to separately route the different types of data to one or more destinations. As shown, the router may be configured to route the data to a plurality of recipient systems or other destinations. For example, the router may be configured to direct the hexadecimal data to a recipient system, such as a console, configured to accept the hexadecimal data, thereby effectively converting the HL7 data to hexadecimal data for use by the recipient system. See block 64. Additionally, the router of the illustrated embodiment may be configured to route the original HL7 data to a different recipient system that is configured to receive and interpret HL7 data, thereby serving as a pass through for the HL7 data. See block 66.

Figure 6:
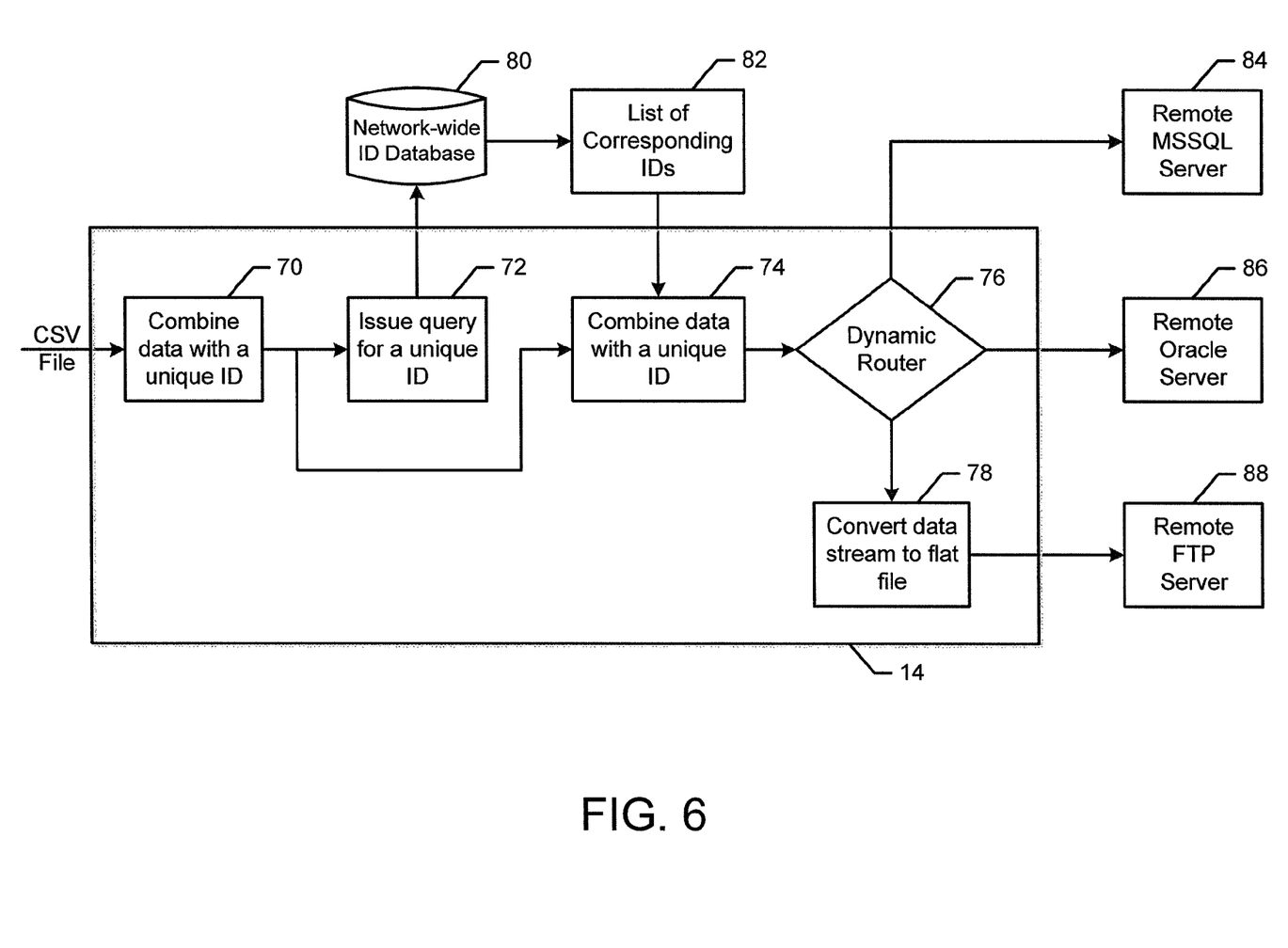
FIG. 6 is a flowchart illustrating operations performed by the processing circuitry of a further embodiment of the present invention.

As yet another example, FIG. 6 illustrates processing circuitry 14 that is configured to receive a CSV data stream and to provide the data, following conversion, to a plurality of different recipient systems 12. The CSV data stream may include a plurality of entries associated with a social security number. In the illustrated embodiment, the CSV data stream may be initially directed to a processing module 70 configured to remove duplicate entries. The configuration file 30 may then direct the data to a processing module 72 that is configured to query a network or a third party database 80 in order to obtain a unique network-wide identifier (ID) corresponding to the social security number associated with the data. See block 82. The data may also be directed by the configuration file to a processing module 74 configured to combine the data with the unique network-wide ID and to then provide the resulting data to a router 76, which may be embodied by the same or a different processing module. The router may be configured to direct the data to a plurality of recipient systems, such as a remote structured query language (SQL) server 84 and a remote Oracle server 86, each of which may accept and operate upon the CSV file. The router may also be configured to route the data to a processing module 78 that is configured to convert the data stream to a flat file and to thereafter provide the data as represented by the flat file to a remote file transfer protocol (FTP) server 88 that is configured to accept a flat file.

Although a number of examples have been provided, the processing circuitry 14 may be configured in other manners in order to appropriately process data provided by a source system 10 in accordance with a first data stream type prior to delivering the data in accordance with a second data stream type to a recipient system 12. For example, the processing circuitry may receive images which may be loaded, embossed and saved. As described above, the images may be processed by a style sheet in order to identify one or more events which may be logged or may be the subject of a notification to a recipient system, if detected. The updated images of this embodiment may then be dynamically routed to a recipient system, such as the web interface of a recipient system.

As the foregoing examples illustrate, the processing circuitry 14 may include processing modules configured to perform a variety of different processing functions. In this regard, the processing circuitry may include a processing module configured to filter the data received from the source system 10 by allowing only certain types of the data to be directed to the recipient system 12. For example, the HL7 data received from a source system may be filtered such that only AO8 and AO2 messages are provided to a recipient system with the other HL7 data being filtered out. As another example, the processing circuitry may include a processing module configured to patch data provided by a source system that does not follow a predefined convention such that the data delivered to the recipient system may be properly interpreted. Additionally, the processing circuitry may be configured to include a processing module configured to execute a command line utility provided by a database that serves as a recipient system with the processing module configured to execute the command line utility by receiving HL7 data and transforming the HL7 data into tokenized SQL statements for provision to the database. As such, the processing module that is configured to execute the command line utility may utilize various command line arguments, such as use ssh, remote db host, connected—timeout, etc., provided by the command line utility interface of the database that serves as a recipient system.

FIG. 2 is a flowchart illustrating the operations performed by a method, apparatus and computer program product, such as the processing circuitry 14 in accordance with one embodiment of the present invention. It will be understood that each block of the flowchart, and combinations of blocks in the flowchart, may be implemented by various means, such as hardware, firmware, processor, circuitry and/or other device associated with execution of software including one or more computer program instructions. For example, one or more of the procedures described above may be embodied by computer program instructions. In this regard, the computer program instructions which embody the procedures described above may be stored by a non-transitory memory 18 of an apparatus employing an embodiment of the present invention and executed by a processor 16 in the apparatus. As will be appreciated, any such computer program instructions may be loaded onto a computer or other programmable apparatus (e.g., hardware) to produce a machine, such that the resulting computer or other programmable apparatus provides for implementation of the functions specified in the flowchart blocks. These computer program instructions may also be stored in a non-transitory computer-readable storage memory that may direct a computer or other programmable apparatus to function in a particular manner, such that the instructions stored in the computer-readable storage memory produce an article of manufacture, the execution of which implements the function specified in the flowchart blocks. The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowchart blocks. As such, the operations of FIG. 2, when executed, convert a computer or processing circuitry into a particular machine configured to perform an example embodiment of the present invention. Accordingly, the operations of FIG. 2 define an algorithm for configuring a computer or processing circuitry, e.g., processor, to perform an example embodiment. In some cases, a general purpose computer may be provided with an instance of the processor which performs the algorithm of FIG. 2 to transform the general purpose computer into a particular machine configured to perform an example embodiment.

Accordingly, blocks of the flowchart support combinations of means for performing the specified functions and combinations of operations for performing the specified functions. It will also be understood that one or more blocks of the flowchart, and combinations of blocks in the flowchart, can be implemented by special purpose hardware-based computer systems which perform the specified functions, or combinations of special purpose hardware and computer instructions.

In some embodiments, certain ones of the operations above may be modified or further amplified. It should be appreciated that each of the modifications, optional additions or amplifications below may be included with the operations above either alone or in combination with any others among the features described herein.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in That which is claimed:

1. A method comprising:
receiving data from any one of a plurality of source systems, wherein the data received from each source system has a respective first data stream type;
determining a recipient system of the data from among a plurality of candidate recipient systems, wherein determining the recipient system comprises determining a second data stream type accepted by the recipient system;
directing the data to a first processing module of a plurality of processing modules based upon the source system, the recipient system and the first and second data stream types, wherein the first processing module is associated with a respective pair of first and second data stream types;
processing the data with the first processing module based upon the recipient system and the second data stream type accepted by recipient system; and
routing the data following the processing to at least one of a plurality of candidate destinations including the recipient system, wherein routing the data comprises routing the data to a second processing module of the plurality of processing modules for further processing prior to delivery to the recipient system,
wherein the method further comprises accessing a configuration file that defines an ordered sequence of a plurality of processing modules to be traversed in order to process the data prior to delivery to the recipient system, and wherein the routing and directing are performed in response to the ordered sequence of the plurality of processing modules defined by the configuration file.

2. A method according to claim 1 wherein processing the data comprises processing the data with a style sheet to identify a predefined event, and wherein the method further comprises notifying the recipient system in an instance in which the predefined event is identified.

3. A method according to claim 1 wherein processing the data comprises processing the data with a style sheet to determine one or more statistics related to the data received from the source system.

4. A method according to claim 1 wherein routing the data comprises routing the data to a plurality of destinations.

5. A method according to claim 1 wherein the configuration file defines a plurality of ordered sequences based upon the source system, the recipient system and the first and second data stream types, and wherein one or more of the processing modules are included in two or more of the ordered sequences.

6. A method according to claim 1 wherein processing the data with the first processing module comprises converting data of the first data stream type to data of the second data stream type, and wherein the method further comprises processing the data with the second processing module in order to customize the data of the second data stream type in accordance with the recipient system.

7. A method according to claim 1 wherein routing the data comprises routing the data following the processing to an application programming interface of the recipient system, wherein the second data stream type accepted by the recipient system is defined by the application programming interface.

8. An apparatus comprising processing circuitry configured to:

receive data from any one of a plurality of source systems, wherein the data received from each source system has a respective first data stream type;
determine a recipient system of the data from among a plurality of candidate recipient systems, wherein the processing circuitry is configured to determine the recipient system by determining a second data stream type accepted by the recipient system;
direct the data to a first processing module of a plurality of processing modules based upon the source system, the recipient system and the first and second data stream types, wherein the first processing module is associated with a respective pair of first and second data stream types;
process the data with the first processing module based upon the recipient system and the second data stream type accepted by recipient system; and
route the data following the processing to at least one of a plurality of candidate destinations including the recipient system, wherein the processing circuitry is configured to route the data by routing the data to a second processing module of the plurality of processing modules for further processing prior to delivery to the recipient system,
wherein the processing circuitry is further configured to access a configuration file that defines an ordered sequence of a plurality of processing modules to be traversed in order to process the data prior to delivery to the recipient system, and wherein the processing circuitry is configured to route and direct the data in response to the ordered sequence of the plurality of processing modules defined by the configuration file.

9. An apparatus according to claim 8 wherein the processing circuitry is configured to process the data by processing the data with a style sheet to identify a predefined event, and wherein the processing circuitry is further configured to notify the recipient system in an instance in which the predefined event is identified.

10. An apparatus according to claim 8 wherein the processing circuitry is configured to process the data by processing the data with a style sheet to determine one or more statistics related to the data received from the source system.

11. An apparatus according to claim 8 wherein the processing circuitry is configured to route the data by routing the data to a plurality of destinations.

12. An apparatus according to claim 8 wherein the configuration file defines a plurality of ordered sequences based upon the source system, the recipient system and the first and second data stream types, and wherein one or more of the processing modules are included in two or more of the ordered sequences.

13. An apparatus according to claim 8 wherein the processing circuitry is configured to process the data with the first processing module by converting data of the first data stream type to data of the second data stream type, and wherein the processing circuitry is further configured to process the data with the second processing module in order to customize the data of the second data stream type in accordance with the recipient system.

14. An apparatus according to claim 8 wherein the processing circuitry is configured to route the data by routing the data following the processing to an application programming interface of the recipient system, wherein the second data stream type accepted by the recipient system is defined by the application programming interface.

15. A computer program product comprising at least one non-transitory computer-readable storage medium having computer-executable program code portions stored therein, the computer-executable program code portions comprising program code instructions for:

receiving data from any one of a plurality of source systems, wherein the data received from each source system has a respective first data stream type;

determining a recipient system of the data from among a plurality of candidate recipient systems, wherein determining the recipient system comprises determining a second data stream type accepted by the recipient system;

directing the data to a first processing module of a plurality of processing modules based upon the source system, the recipient system and the first and second data stream types, wherein the first processing module is associated with a respective pair of first and second data stream types;

processing the data with the first processing module based upon the recipient system and the second data stream type accepted by recipient system; and routing the data following the processing to at least one of a plurality of candidate destinations including the recipient system, wherein the program code instructions for routing the data comprise program code instructions for routing the data to a second processing module of the plurality of processing modules for further processing prior to delivery to the recipient system, wherein the computer-executable program code portions further comprise program code instructions for accessing a configuration file that defines an ordered sequence of a plurality of processing modules to be traversed in order to process the data prior to delivery to the recipient system, and wherein program code instructions for routing and for directing are performed in response to the ordered sequence of the plurality of processing modules defined by the configuration file.

16. A computer program product according to claim 15 wherein the program code instructions for processing the data comprise program code instructions for processing the data with a style sheet to identify a predefined event, and wherein the computer-executable program code portions further comprise program code instructions for notifying the recipient system in an instance in which the predefined event is identified.

17. A computer program product according to claim 15 wherein the program code instructions for processing the data comprise program code instructions for processing the data with a style sheet to determine one or more statistics related to the data received from the source system.

18. A computer program product according to claim 15 wherein the configuration file defines a plurality of ordered sequences based upon the source system, the recipient system and the first and second data stream types, and wherein one or more of the processing modules are included in two or more of the ordered sequences.

19. A computer program product according to claim 15 wherein the program code instructions for processing the data with the first processing module comprise program code instructions for converting data of the first data stream type to data of the second data stream type, and wherein the computer-executable program code portions further comprise program code instructions for processing the data with the second processing module in order to customize the data of the second data stream type in accordance with the recipient system.

20. A computer program product according to claim 15 wherein the program code instructions for routing the data comprise program code instructions for routing the data following the processing to an application programming interface of the recipient system, wherein the second data stream type accepted by the recipient system is defined by the application programming interface.

* * * * *